United States Patent
Sato et al.

(10) Patent No.: US 9,355,855 B2
(45) Date of Patent: May 31, 2016

(54) PLASMA ETCHING APPARATUS COMPONENT AND MANUFACTURING METHOD FOR THE SAME

(75) Inventors: Michio Sato, Yokohama (JP); Takashi Hino, Yokohama (JP); Takashi Rokutanda, Yokohama (JP); Masashi Nakatani, Kamakura (JP)

(73) Assignees: KABUSHIKI KAISHA TOSHIBA, Tokyo (JP); TOSHIBA MATERIALS CO., LTD., Kanagawa-Ken (JP)

( * ) Notice: Subject to any disclaimer, the term of this patent is extended or adjusted under 35 U.S.C. 154(b) by 42 days.

(21) Appl. No.: 13/989,092

(22) PCT Filed: Nov. 29, 2011

(86) PCT No.: PCT/JP2011/077533
§ 371 (c)(1),
(2), (4) Date: May 23, 2013

(87) PCT Pub. No.: WO2012/073954
PCT Pub. Date: Jun. 7, 2012

(65) Prior Publication Data
US 2013/0251949 A1    Sep. 26, 2013

(30) Foreign Application Priority Data

Dec. 1, 2010  (JP) ................ 2010-268779

(51) Int. Cl.
*B44C 5/04*  (2006.01)
*B32B 5/16*  (2006.01)
*C23C 4/10*  (2006.01)
(Continued)

(52) U.S. Cl.
CPC ........... *H01L 21/3065* (2013.01); *C23C 4/124* (2013.01); *C23C 24/04* (2013.01); *H01J 37/32477* (2013.01); *H01J 2237/334* (2013.01); *Y10T 428/24413* (2015.01);
(Continued)

(58) Field of Classification Search
None
See application file for complete search history.

(56) References Cited

U.S. PATENT DOCUMENTS 5,271,965 A * 12/1993 Browning .............. 427/446
7,479,464 B2    1/2009 Sun et al.
(Continued)

FOREIGN PATENT DOCUMENTS

JP  2002227842 A  8/2002
JP  2002273276 A  9/2002
(Continued)

OTHER PUBLICATIONS

International Search Report (in Japanese with English translation), mailed Jan. 31, 2012; ISA/JP.
(Continued)

*Primary Examiner* — David Sample
*Assistant Examiner* — Nicole T Gugliotta
(74) *Attorney, Agent, or Firm* — Harness, Dickey & Pierce, PLC (57) ABSTRACT

The present invention provides a plasma etching apparatus component 1 includes a base material 10 and an yttrium oxide coating 20 formed by an impact sintering process and configured to cover a surface of the base material. The yttrium oxide coating 20 contains at least one of particulate portions and non-particulate portions. The yttrium oxide coating 20 has a film thickness of 10 μm or above and a film density of 90% or above. The particulate portions have an area coverage ratio of 0 to 80% and the non-particulate portions have an area coverage ratio of 20 to 100%.

7 Claims, 2 Drawing Sheets

(51) Int. Cl.
  *H01L 21/3065* (2006.01)
  *C23C 24/04* (2006.01)
  *C23C 4/12* (2016.01)
  *H01J 37/32* (2006.01)

(52) U.S. Cl.
  CPC ............. *Y10T 428/25* (2015.01); *Y10T 428/26* (2015.01); *Y10T 428/265* (2015.01)

(56) References Cited

U.S. PATENT DOCUMENTS

2008/0108225 A1* 5/2008 Sun et al. ...................... 438/758
2009/0304519 A1 12/2009 Yasui et al.
2012/0247667 A1* 10/2012 Hashiguchi et al. ....... 156/345.3

FOREIGN PATENT DOCUMENTS

| | | | | |
|---|---|---|---|---|
| JP | 2005-158933 A | 6/2005 | | |
| JP | 2006-108178 | * 4/2006 | .......... | H01L 21/3065 |
| JP | 2006-108178 A | 4/2006 | | |
| JP | 2006241514 A | 9/2006 | | |
| JP | 2007023332 A | 2/2007 | | |
| JP | 2007-326744 A | 12/2007 | | |
| JP | 4084689 B2 | 4/2008 | | |
| JP | 2008-106363 A | 5/2008 | | |
| JP | 2009-293061 | * 12/2009 | ................ | C23C 4/10 |
| JP | 2009-293061 A | 12/2009 | | |
| WO | WO2008/087830 A | 7/2008 | | |

OTHER PUBLICATIONS

International Preliminary Report on Patentability, including Written Opinion of the International Searching Authority, issued Jun. 4, 2013, in corresponding PCT/JP2011/077533 application. (English Translation provided.).

* cited by examiner

PLASMA ETCHING APPARATUS COMPONENT AND MANUFACTURING METHOD FOR THE SAME

CROSS-REFERENCE TO RELATED APPLICATIONS

This application is a 371 U.S. National Stage of International Application No. PCT/JP2011/077533, filed on Nov. 29, 2011, which claims priority to Japanese Patent Application No. 2010-268779, filed on Dec. 1, 2010. The contents of the above applications are incorporated herein by reference in their entirety.

TECHNICAL FIELD

The present invention relates to a plasma etching apparatus component and a manufacturing method for the plasma etching apparatus component.

BACKGROUND ART

In the manufacture of semiconductor devices, micro-interconnects are normally formed via formation of a $SiO_2$ or other insulating film by a sputtering apparatus or CVD apparatus and isotropic or anisotropic etching of Si or $SiO_2$ by an etching apparatus. Generally these apparatuses use a plasma discharge to improve film deposition rate and etching performance. For example, a plasma etching apparatus is used as an etching apparatus.

As a dry etching process which uses a plasma etching apparatus, for example, a method is known which uses plasma etching for microfabrication of Si and a dry etching process of various thin films during manufacture of a semiconductor, where the various thin films include an insulating film, electrode film, and wiring film deposited on a substrate.

Plasma etching is performed, for example, as follows. First, plural Si substrates are mounted on a surface of a lower electrode placed in a chamber of a dry etching apparatus, facing an upper electrode. Next, fluorine (F)-based gas such as $CF_4$ or chlorine (Cl)-based gas such as $Cl_2$ is introduced among the mounted substrates and a plasma discharge is induced between the electrodes to generate fluorine-based plasma or chlorine-based plasma. Furthermore, by dry-etching the thin films formed on the substrates with active ions and radicals produced in the generated plasma, the process of plasma etching is finished.

When thin films of GaN, InN, and the like on a substrate are plasma-etched, plasma components and etched material react with each other to produce reaction products such as $SiF_4$ and fluorocarbons. Most of the reaction products are discharged from the chamber in a gaseous state by an exhaust pump, and part of the reaction products is deposited in the chamber in a solid state to form adherent films. Preferably, the adherent films of reaction products are removed.

Thus, a process is known which removes the adherent films by performing dry etching using fluorine-based plasma or chlorine-based plasma and discharging the reaction products (adherent films) adhering to the inside of the chamber out of the chamber. The dry etching, which is intended here to remove the reaction products (adherent films), is performed by generating fluorine-based plasma or chlorine-based plasma under gas conditions different from those for dry etching of the thin films described above.

However, if the reaction products making up the adherent films are fluorocarbon-based etching products, the reaction products do not react properly with fluorine-based plasma or chlorine-based plasma. Thus, the reaction products remain in the chamber. Consequently, if the remaining adherent films peel off and get mixed in the substrate, this could cause pattern defects or reduce yields.

Thus, conventionally, with respect to those parts of the plasma etching apparatus which are irradiated with plasma, including the chamber, a coating with high plasma resistance and corrosion resistance is applied to a surface of a base material to prevent formation of reaction products. As such coatings, an yttrium oxide ($Y_2O_3$) coating and aluminum oxide ($Al_2O_3$) coating are known. These coatings are effective in curbing generation of reaction products and preventing parts damage caused by plasma attacks.

For example, Patent Document 1 describes a $Y_2O_3$ film obtained by heat-treating a $Y(OH)_3$ sol solution applied to a base material, while Patent Document 2 describes an $Al_2O_3$ thermally sprayed coating.

CITATION LIST

Patent Documents

Patent Document 1: Specification of Japanese Patent No. 4084689
Patent Document 2: Japanese Patent Laid-Open No. 2006-108178

SUMMARY OF THE INVENTION

Problems to be Solved by the Invention

However, an yttrium oxide sprayed coating or aluminum oxide sprayed coating formed by a thermal spraying process is made of flat yttrium oxide or aluminum oxide particles, where the flat yttrium oxide or aluminum oxide particles are produced by processes that molten yttrium oxide or aluminum oxide particles are collided with the surface of a base material and then the molten yttrium oxide or aluminum oxide particles are cooled and deposited on the surface of the base material. Therefore, the yttrium oxide sprayed coating or aluminum oxide sprayed coating formed by the thermal spraying process is prone to a large number of microcracks as well as to residual strains.

That is, when the yttrium oxide or aluminum oxide particles molten by a spray heat source are rapidly cooled and solidified into flat shapes by colliding with the surface of the base material, microcracks generate on surfaces of the flat particles, and residual strains leaves in the flat particles.

When such yttrium oxide or aluminum oxide coating is irradiated with active radicals generated by a plasma discharge, the microcracks are attacked and expanded by the active radicals. Then, the microcracks propagate the coating when the internal strains are released. Consequently, the thermally sprayed coating is chipped, thereby particles deriving from the thermally sprayed coating are prone to be generated, and reaction products adhering to the thermally sprayed coating peel off, thereby particles deriving from the reaction products are prone to be generated. Further, the generation of the particles reduces product yields of semiconductor devices and the like and increases cleaning and replacement frequencies of plasma etching apparatus components. Furthermore, the generation of the particles reduces productivity and increases film deposition costs.

Further, when a thermally sprayed coating is formed by plasma spraying which uses plasma as a heat source, oxide powder, i.e., powder supplied to the plasma has a particle size almost as large as 10 to 45 μm. Consequently, the resulting thermally sprayed coating contains voids as much as up to about 15% and has a surface roughness as high as about 6 to 10 µm in terms of average roughness Ra.

As described above, a thermally sprayed coating which is formed on a plasma etching apparatus component has a large number of voids and high surface roughness. Thus, when the plasma etching apparatus component is used, the life of the plasma etching apparatus component will be shortened because plasma etching of the base material proceeds via the voids, and particle generation will increase because the thermally sprayed coating becomes brittle by concentration of the plasma discharge on convex portions of the thermally sprayed coating.

Further, line width of recent semiconductor elements has been reduced in order to achieve greater packaging density. The reductions in line width have gone, for example, as far as 0.18 µm, 0.13 µm, and even 0.09 µm or below. When such narrowed wiring or elements containing the wiring is used, mixture of even submicroscopic particles which have 0.2 µm of diameter, for example, will cause defects of wiring or defects of elements. Consequently, in recent years, there has been strong demand to curb generation of even submicroscopic particles.

In forming a thermally sprayed coating, normally a blasting process is performed as pre-treatment for coating formation, where the blasting process involves blowing abrasive grains or the like together with high-pressure granules against the surface of the base material. However, if the blasting process is performed in this way, residual fragments of blasting material (abrasive grains) are left on the surface of the base material or a fractured formation is produced on the surface of the base material.

If a thermally sprayed coating is formed on the surface of the base material on which blasting material is left or a fractured formation is produced, stresses act on an interface between the base material and thermally sprayed coating, and film separation of the entire thermally sprayed coating is prone to be generated. Here, the stresses are heat membrane stresses resulting from temperature changes caused by the plasma discharge. Especially when pressure and abrasive grain size are increased in the blasting process, film separation occurs prominently. Therefore, the life of the thermally sprayed coating varies greatly depending on conditions of the blasting process.

In this way, the method of forming a thermally sprayed coating on the surface of the base material of a plasma etching apparatus component has a problem in that the thermally sprayed coating tends to become a particle source, decreasing product yields and that the life of the thermally sprayed coating will change according to circumstances of the blasting process.

The present invention has been made in view of the above circumstances and has an object to provide a plasma etching apparatus component and a manufacturing method for the plasma etching apparatus component which can stably and effectively curb particle generation from a coating and peeling of the coating due to high corrosion resistance and strength of the coating.

Means for Solving the Problems

The present invention has been completed based on a finding that if an yttrium oxide coating is formed on the surface of a base material by an impact sintering process instead of a thermally sprayed coating formed by the conventional thermal spraying process, since the yttrium oxide which makes up the coating is practically free of internal defects, internal strains, and microcracks, corrosion resistance and strength of the coating are increased, making it possible to stably and effectively curb particle generation from the coating and peeling of the coating while curbing production of reaction products on a surface of the coating and generation of particles from the reaction products.

To solve the above problems, the present invention provides a plasma etching apparatus component comprising: a base material; and an yttrium oxide coating formed by an impact sintering process and configured to cover a surface of the base material, wherein the yttrium oxide coating contains at least one of particulate portions made of yttrium oxide and non-particulate portions made of yttrium oxide, where the particulate portions are portions in which a grain boundary partitioning inner and outer regions of a crystal grain is observed under a microscope, and the non-particulate portions are portions in which the grain boundary is not observed under a microscope, the yttrium oxide coating has a film thickness of 10 µm or above and a film density of 90% or above, and when a surface of the yttrium oxide coating is observed under a microscope, in an observation field of 20 µm×20 µm, the particulate portions have an area coverage ratio of 0 to 80% and the non-particulate portions have an area coverage ratio of 20 to 100%.

Further, to solve the above problems, the present invention provides a manufacturing method for a plasma etching apparatus component which includes a base material, and an yttrium oxide coating formed by an impact sintering process and configured to cover a surface of the base material, the manufacturing method comprising: a step of supplying raw slurry containing yttrium oxide base powder to a combustion flame sprayed from a combustion chamber; and a step of spraying the yttrium oxide base powder in the combustion flame at the surface of the base material at a spraying speed of 400 to 1000 m/sec.

Advantages of the Invention

The plasma etching apparatus component and the manufacturing method for the plasma etching apparatus component according to the present invention improve plasma resistance of the plasma etching apparatus component and stably and effectively curb particle generation.

MODE FOR CARRYING OUT THE INVENTION

A plasma etching apparatus component and a manufacturing method for the plasma etching apparatus component according to the present invention will be described below.

[Plasma Etching Apparatus Component]

The plasma etching apparatus component according to the present invention includes a base material, and an yttrium oxide coating configured to cover a surface of the base material.

(Base Material)

The base material used for the plasma etching apparatus component according to the present invention is a member of the plasma etching apparatus component which is coated with the yttrium oxide coating.

The base material can be a member of the plasma etching apparatus component which is exposed to plasma and radicals generated in a plasma etching process. Examples of such members include members of semiconductor manufacturing equipment or liquid crystal device manufacturing equipment, such as a wafer placement member, inner wall portion, deposition shield, insulating ring, upper electrode, baffle plate, focus ring, shield ring, and bellows cover.

Possible materials for the base material include ceramics such as quartz and metal such as aluminum.

(Yttrium Oxide Coating)

The yttrium oxide coating used for the plasma etching apparatus component according to the present invention is formed by an impact sintering process and configured to cover a surface of the base material.

The impact sintering process here involves supplying step for supplying materials containing base powder which is to be sintered, such as yttrium oxide base powder, into a combustion flame of combustion gas, and sintering and bonding step for sintering and bonding the base powder on the surface of base material by destructive heat deriving from collision. As a result, according to the impact sintering process, particles are deposited on the surface of base material, and a coating is formed on the surface of the base material. Further, since destructive heat is used, base powder can be sprayed at high speed together with the combustion gas of the combustion flame toward the base material to be coated unlike thermal spraying which involves melting base powder. In other words, with the impact sintering process, unmolten yttrium oxide base powder is sprayed at the base material and adheres to the surface of the base material, thereby forming a coating.

According to the present invention, the base powder refers to particles sprayed in order to create a coating. For example, the yttrium oxide base powder means yttrium oxide particles sprayed in order to create an yttrium oxide coating. On the other hand, the yttrium oxide particles contained in an yttrium oxide coating is simply referred to as yttrium oxide particles.

When viewed under a microscope, normally, three-dimensionally shaped portion with great depth from the surface and planar portion with small depth are observed on the surface of a coating formed by the impact sintering process.

The reason is as follows.

That is, with the impact sintering process, when sprayed unmolten base powder collides with the surface of the base material or a surface of an already formed coating at high speed, particles of the base powder as they are or fragments of the base powder crushed by collision are sintered and bonded by destructive heat of the collision. The destructive heat of the collision refers to the heat produced when the base powder is deformed or crushed by collision.

In this way, since the coating produced by the impact sintering process are formed by sintering and bonding by destructive heat deriving from collision, the coating contains three-dimensionally shaped portions and planar portions. The three-dimensionally shaped portions are portions in which particles of the base powder remain as they are or maintain shapes close to the shapes of their fragments of the base powder due to a small amount of destructive heat resulting from a small number of base powder collisions. And the planar portions are portions which are produced by bonding or greatly deforming base powder or its fragments due to a large amount of destructive heat resulting from a large number of base powder collisions.

The three-dimensionally shaped portion, in which a grain boundary partitioning the three-dimensionally shaped portion from an outer region is often observed under a microscope, is referred to herein as a particulate portion. On the other hand, the planar portion, in which a grain boundary partitioning the planar portion from an outer region often is not observed under a microscope, is referred to herein as a non-particulate portion. That is, on an yttrium oxide coating, a portion in which a grain boundary of an yttrium oxide particle is observed is referred to as a particulate portion and a portion in which a grain boundary of an yttrium oxide particle is not identified is referred to as a non-particulate portion.

The grain boundaries of a grain of the particulate portions can be identified, for example, by observing at a magnification of 5000 using an electron microscope.

The particulate portions, which undergo only a small degree of deformation from the base powder or its fragments, normally have particle-shaped contours. On the other hand, the non-particulate portions, which undergo a large degree of deformation from the base powder or its fragments, normally do not have particle-shaped contours.

Since the coating produced by the impact sintering process are formed by spraying rarely molten base powder at high speed, the manner of collision of the base powder varies depending on spraying conditions. Further, when rarely molten base powder is sprayed, since materials containing base powder are normally supplied and sprayed into a combustion flame of combustion gas, the manner of collision of the base powder varies depending on whether the base powder exists in the combustion flame or on a surface of the combustion flame. Consequently, the coating formed by the impact sintering process tends to contain a mixture of particulate portions and non-particulate portions.

Further, since the coating formed by the impact sintering process contains a mixture of the particulate portions and the non-particulate portions and gaps among the particulate portions are filled with the non-particulate portions, the coating tends to have a high film density. The film density here refers to a ratio of an actual volume of substances making up the coating to an apparent volume of the coating.

Incidentally, with the conventional thermal spraying process, since molten base powder is sprayed, almost none of substances making up the thermally sprayed coating obtained after solidification maintains a crystal structure or powder shape of the base powder. Consequently, stresses occur in the coating formed by the thermal spraying process. Further, since the coating formed by the thermal spraying process is deposited as flat-shaped particles on the surface of base material, microcracks will develop on surfaces of the flat-shaped particles.

In contrast, with the impact sintering process, since the coating is formed by spraying almost unmolten base powder at high speed, the crystal structure and powder shape of the base powder are maintained when the base powder is sprayed. Consequently, although some of the substances making up the resulting coating change their crystal structure into that of the base powder under the influence of destructive heat resulting from the impact, the rest of the substances maintains the crystal structure of the base powder. Regarding microscopic shapes of the substances making up the resulting coating, although part of the coating becomes the non-particulate portions greatly differing from the shape of the base powder under the influence of destructive heat resulting from the impact, the rest of the coating becomes the particulate portions with shapes similar to the shape of the base powder or shape of crushed base powder. Consequently, with the coating formed by the impact sintering process, the stresses occurring in the coating are appropriate, resulting in high film strength.

Further, the coating formed by the impact sintering process is preferable because the crystal structure of the substances making up the resulting coating can be controlled if manufacturing conditions in the use of the impact sintering process is adjusted. For example, when the crystal structure of base powder is made up of only cubic crystals and the crystal structure of the coating formed by the impact sintering process is made up of cubic crystals and monoclinic crystals, abundance ratios of cubic crystals and monoclinic crystals in the coating can be adjusted by adjusting the manufacturing conditions in the use of the impact sintering process.

Furthermore, with the impact sintering process, since the coating is formed by spraying almost unmolten base powder at high speed, the particulate portions of the coating maintain the shape of the base powder as it is or shape of crushed base powder, and thus have a shape close to a spherical shape. Consequently, in the particulate portions of the coating formed by the impact sintering process, microcracks are less prone to be developed on the surfaces of the particle which is close to a spherical shape.

Furthermore, in the non-particulate portions of the coating formed by the impact sintering process, since the base powder or its fragments are bonded or greatly deformed due to a large amount of destructive heat resulting from collisions, deposited substances are bonded strongly. Consequently, the coating formed by the impact sintering process tends to be a dense, strongly bonded coating due to the existence of the non-particulate portions.

The yttrium oxide coating according to the present invention is formed by the impact sintering process using yttrium oxide base powder as base powder.

Yttrium oxide has high corrosion resistance against plasma attacks by plasmas such as chlorine-based plasma and fluorine-based plasma as well as against radical attacks by radicals such as active F radicals and Cl radicals. Therefore, yttrium oxide is preferable as coatings for plasma etching apparatus components.

Purity of yttrium oxide in the yttrium oxide coating is normally 99.9% or above, and preferably 99.99% or above.

When the purity of yttrium oxide in the yttrium oxide coating is 99.9% or above, the possibility of impurities being mixed in plasma-etched products is small in performing plasma etching using plasma etching apparatus components.

Especially, when the purity of yttrium oxide in the yttrium oxide coating is 99.99% or above, even in processes such as semiconductor manufacturing processes in which mixing of impurities in products is strictly limited, there is practically no possibility of impurities being mixed in products.

On the other hand, when the purity of yttrium oxide in the yttrium oxide coating is less than 99.9%, there is a possibility that impurities in the yttrium oxide of the yttrium oxide coating will get mixed in plasma-etched products during plasma etching.

The yttrium oxide coating according to the present invention contains at least one of particulate portions made of yttrium oxide and non-particulate portions made of yttrium oxide, where the particulate portions are portions in which a grain boundary partitioning inner and outer regions of a crystal grain is observed under a microscope, and the non-particulate portions are portions in which the grain boundary is not observed under a microscope.

Regarding the grain boundary of the particulate portion, for example, when the surface of the yttrium oxide coating is observed at a magnification of 5000 using an electron microscope, if a line highly contrasted with a central portion of the particulate portion is observed between the particulate portion and a portion around the particulate portion, i.e., a portion adjacent to the particulate portion, the line can be recognized as a grain boundary. Normally, contrast is such that the line around the particulate portion appears in a darker tone than that of the central portion of the particulate portion.

On the other hand, in the case of a non-particulate portion, a grain boundary, i.e., a line highly contrasted with a particle-shaped portion, is not observed around the particle-shaped portion.

<Ratio Between Particulate Portions and Non-Particulate Portions>

Regarding the yttrium oxide coating according to the present invention, when the surface of the yttrium oxide coating is observed under a microscope, in an observation field of 20 μm×20 μm, normally the particulate portions have an area coverage ratio of 0 to 80% and the non-particulate portions have an area coverage ratio of 20 to 100%, and preferably the particulate portions have an area coverage ratio of 0 to 50% and the non-particulate portions have an area coverage ratio of 50 to 100%. A sum total of the area coverage ratio of the particulate portions and area coverage ratio of the non-particulate portions is 100%.

To calculate the area coverage ratio of the particulate portions and area coverage ratio of the non-particulate portions, for example, an observation field of 20 μm×20 μm is set at three or more locations and an average value of the area coverage ratio of the particulate portions and an average value of the area coverage ratio of the non-particulate portions are calculated over the observation fields.

If the area coverage ratio of the particulate portions in the yttrium oxide coating exceeds 80%, the yttrium oxide coating is subject to reduced density or reduced bonding strength, resulting in a possibility of crack development.

The reason is as follows.

That is, when the area coverage ratio of the particulate portions is so high as to exceed 80%, this means that there is a large area in which the destructive heat resulting from the impact on yttrium oxide base powder serving as base powder is not sufficient. The area in which the destructive heat resulting from the impact is not sufficient is where the sprayed yttrium oxide base powder is cooled suddenly on the surface of the base material or yttrium oxide coating. Therefore, the resulting yttrium oxide coating is subject to reduced yttrium oxide density or reduced bonding strength, thereby crack development is prone to be generated.

<Average Particle Size of Particulate Portions>

In the yttrium oxide coating, an average particle size of the particulate portions is normally 2 μm or below, and preferably 0.5 to 2 μm.

The average particle size of the particulate portions is an average value of particle sizes of the particulate portions. Further, the particle size of a particulate portion is the length of a line segment linking the most distant two points on the grain boundary of the particulate portion shown in a photo taken by observing the surface of the yttrium oxide coating under a microscope. The particle sizes of 50 particulate portions are measured and an arithmetic mean value of the particle sizes of the 50 particulate portions is determined as the average particle size of the particulate portions.

Preferably, the average particle size of the particulate portions is 2 μm or below from the standpoint of increasing the film density because this will reduce the gaps (triple points) among the yttrium oxide particles of the particulate portions.

On the other hand, when the average particle size of the particulate portions exceeds 2 μm, the gaps among the yttrium oxide particles become larger and there is a possibility that the film density will be reduced.

<Overall Average Particle Size of Particulate Portions and Non-Particulate Portions>

In the yttrium oxide coating, an overall average particle size of particulate portions and non-particulate portions is normally 5 μm or below, and preferably 1 to 5 μm.

Here, the overall average particle size of particulate portions and non-particulate portions is an arithmetic mean value of the average particle size of the particulate portions and average particle size of the non-particulate portions.

The average particle size of the non-particulate portions is a diameter of an imaginary circle set on a non-particulate portion shown in a photo taken by observing the surface of the yttrium oxide coating under a microscope. The imaginary circle here is a circle created by assuming that a portion making up the non-particulate portion of an indeterminate form and having a contour equal to or larger than a semicircle is a part of a circumference of the contour. Fifty (50) imaginary circles are established and an arithmetic mean value of the diameters of the 50 imaginary circles is determined as the average particle size of the non-particulate portions.

As described above, the average particle size of the particulate portions is calculated based on 50 line segments of the particulate portions and the average particle size of the non-particulate portions is calculated based on 50 imaginary circles of the non-particulate portions. Thus, the overall average particle size of the particulate portions and non-particulate portions, which is an arithmetic mean value of the average particle size of the particulate portions and the average particle size of the non-particulate portions, is an arithmetic mean value calculated based on the lengths of 50 line segments of the particulate portions and the diameters of the 50 imaginary circles of the non-particulate portions.

Preferably, the overall average particle size of the particulate portions and non-particulate portions is 5 μm or below, because the film density is improved by reducing gaps (triple points) among the yttrium oxide particles of the particulate portions and non-particulate portions, and the film strength is improved by increasing a bonding area between adjacent yttrium oxide particles.

When the overall average particle size of the particulate portions and non-particulate portions exceeds 5 μm, there is a possibility that the film density or film strength will be reduced because of increased gaps among yttrium oxide particles.

<Crystal Structure of Yttrium Oxide Coating>

The yttrium oxide coating contains crystal structures of both cubic crystals and monoclinic crystals.

When a peak value of the strongest peak of a cubic crystal is denoted by Ic and a peak value of the strongest peak of a monoclinic crystal is denoted by Im, both the peak values being obtained by XRD analysis (X-ray diffraction analysis), a peak value ratio Im/Ic of the yttrium oxide coating is normally 0.2 to 0.6.

The XRD analysis is conducted under the condition of a two-theta method using a Cu target at an x-ray tube voltage of 40 kV and an x-ray tube current of 40 mA.

The strongest peak of a cubic crystal is detected in a range of 28 to 30°. Further, the strongest peak of a monoclinic crystal is detected in a range of 30 to 33°.

Yttrium oxide base powder which is the base powder of the yttrium oxide coating is normally made up of only cubic crystals at room temperature.

In contrast, in the yttrium oxide coating according to the present invention, part of cubic crystals changes in crystal structure and turns into monoclinic crystals due to the destructive heat resulting from the impact during formation of the yttrium oxide coating. The peak value ratio Im/Ic of the yttrium oxide coating according to the present invention is normally 0.2 to 0.6 as described above.

When the peak value ratio Im/Ic of the yttrium oxide coating is 0.2 to 0.6, cubic crystals and monoclinic crystals coexist in appropriate quantities, thus the film strength of the yttrium oxide coating increases. Yttrium oxide base powder is normally made of cubic crystals. The coexistence of cubic crystals and monoclinic crystals means that crystal structure has changed by the impact sintering process, and thus means that bonding due to destructive heat is progressing. This bonding improves the film strength.

On the other hand, when the peak value ratio Im/Ic of the yttrium oxide coating exceeds 0.6, monoclinic crystals are too large in quantity, and consequently, internal stresses resulting from transformation into monoclinic crystals strongly act on the yttrium oxide of the yttrium oxide coating. Thus, when the peak value ratio Im/Ic of the yttrium oxide coating exceeds 0.6, film characteristics such as film strength of the yttrium oxide coating deteriorate.

<Film Thickness>

Film thickness of the yttrium oxide coating according to the present invention is normally 10 μm or above, preferably 10 to 200 μm, and more preferably 50 to 150 μm.

When the yttrium oxide coating is 10 μm or above in film thickness, application of the yttrium oxide coating to the surface of the base material is sufficiently effective in curbing particle generation and the like.

When the film thickness of the yttrium oxide coating is too large, application of the yttrium oxide coating to the surface of the base material does not further improve the effect of curbing particle generation. On the contrary, being the film thickness too large is not economical because of increased production cost of the yttrium oxide coating. Thus, preferably, an upper limit of the film thickness of the yttrium oxide coating is set to 200 μm.

On the other hand, when the film thickness of the yttrium oxide coating is less than 10 μm, the application of the yttrium oxide coating to the surface of base material is not sufficiently effective in curbing particle generation and the like. Besides, there is a possibility that the yttrium oxide coating will peel off.

<Film Density>

The yttrium oxide coating according to the present invention has a film density of 90% or above, preferably 95% or above, and more preferably 99 to 100%.

In relation to the yttrium oxide coating according to the present invention, the film density is an index which represents a ratio of an actual volume of the substances making up the coating to an apparent volume of the coating. The film density is a concept contrasted with a void ratio, and a sum total of the film density and void ratio is 100%. For example, a film density of 90% or above means that the void ratio is less than 10%.

The film density is calculated, for example, by taking an enlarged photograph of a cross section along a thickness direction of the yttrium oxide coating at a magnification of 500 using an optical microscope, calculating an area coverage ratio of an empty portion in a measurement area set in the enlarged photograph and designating the area coverage ratio as a void ratio (%), subtracting the void ratio (%) from 100%, and designating a resulting difference as the film density (%).

The measurement area in the enlarged photograph is normally provided as a square area of 200 μm long×200 μm wide=40000 μm$^2$. If a square measurement area of 200 μm×200 μm cannot be found for the reason of small film thickness of the yttrium oxide coating or the like, plural measurement areas with a total area of 40000 μm$^2$ are selected as a measurement area in the enlarged photograph instead of a square area of 200 μm×200 μm, a void ratio (%) per total area of 40000 μm² is calculated, and the film density (%) is calculated based thereon.

When the film density of the yttrium oxide coating is 90% or above, erosion such as plasma attacks via voids in the yttrium oxide coating does not progress significantly, and thus life of the yttrium oxide coating is extended.

On the other hand, when the film density of the yttrium oxide coating is less than 90%, voids abound in the yttrium oxide coating and erosion such as plasma attacks progresses via the voids, and thus the life of the yttrium oxide coating tends to be shortened.

In plasma etching apparatus components, to prevent erosion such as plasma attacks from progressing via voids in the yttrium oxide coating, it is preferable, in particular, to reduce voids in the surface of the yttrium oxide coating. Thus, according to the present invention, preferably, the measurement area set on the enlarged photograph of a cross section along the thickness direction of the yttrium oxide coating in order to measure film density is close to the surface of the yttrium oxide coating.

<Surface Roughness>

Surface roughness Ra of the yttrium oxide coating is normally 3 μm or below, and preferably 2 μm or below.

The surface roughness Ra is measured in accordance with a method described in JIS-B-0601-1994.

When the surface roughness Ra of the yttrium oxide coating is 3 μm or below, plasma attacks and other attacks do not concentrate on asperities formed by the particulate portions and non-particulate portions on the surface of the yttrium oxide coating, and thus the life of the yttrium oxide coating is extended.

On the other hand, when the surface roughness Ra of the yttrium oxide coating exceeds 3 μm, there is a possibility that plasma attacks and other attacks will concentrate on asperities formed by the particulate portions and non-particulate portions on the surface of the yttrium oxide coating, thus the life of the yttrium oxide coating is shortened.

Being formed by the impact sintering process, the yttrium oxide coating according to the present invention is a dense, strongly bonded coating. Further, since the yttrium oxide coating according to the present invention is formed by the impact sintering process, stresses are less prone to occur in the coating and microcracks are less prone to develop on the surface of the coating.

When high insulating properties are required of plasma etching apparatus components, in the plasma etching apparatus component according to the present invention, an oxide coating with high insulating properties may be further provided between the base material and yttrium oxide coating. This oxide coating will be referred to as a primary oxide coating.

As the primary oxide coating, for example, an aluminum oxide coating is used. Of aluminum oxide coatings, an aluminum oxide coating in which aluminum oxide of α-structure is formed densely is preferable because of high insulating properties.

Normally the primary oxide coating has a film thickness of 500 μm or below.

Methods for forming the primary oxide coating are not limited to the impact sintering process. The primary oxide coating may be formed by the impact sintering process or a method other than the impact sintering process.

The plasma etching apparatus component according to the present invention will be described with reference to drawings.

Figure 1:
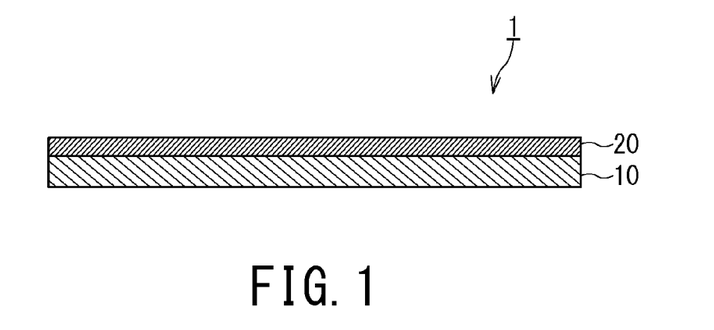
FIG. 1 is a sectional view showing an example of a plasma etching apparatus component according to the present invention.

FIG. 1 is a sectional view showing an example of the plasma etching apparatus component according to the present invention.

As shown in FIG. 1, in a plasma etching apparatus component 1, an yttrium oxide coating 20 is formed on a surface of base material 10.

Figure 2:
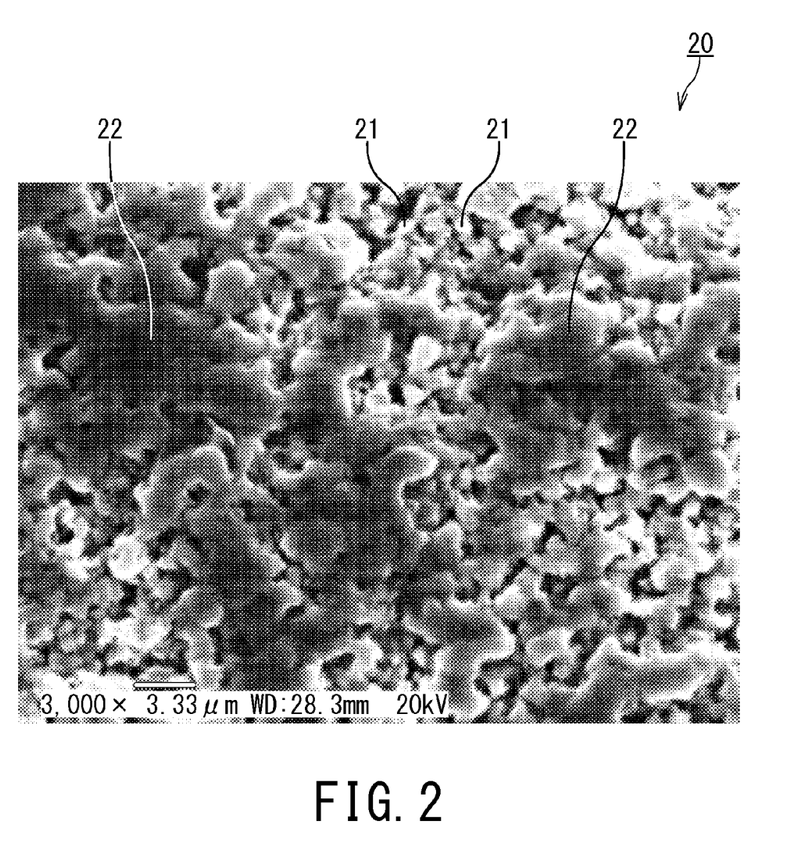
FIG. 2 is an electron micrograph of a surface of an exemplary yttrium oxide coating.
Figure 3:
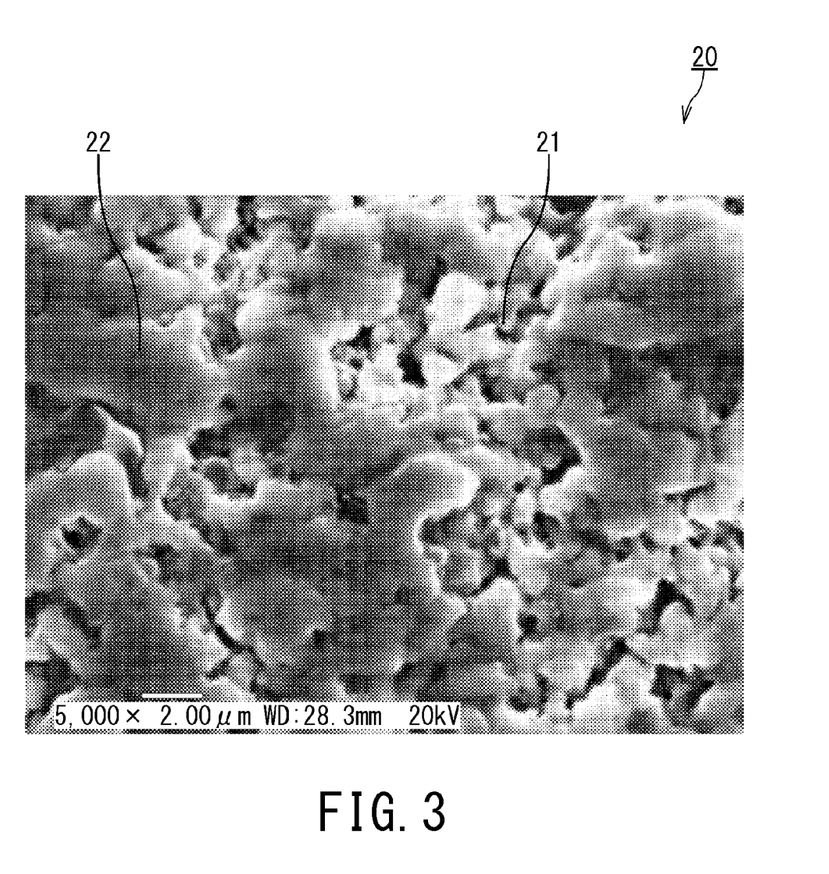
FIG. 3 is an electron micrograph magnifying part of FIG. 2.

FIG. 2 is an electron micrograph of a surface of an exemplary yttrium oxide coating. FIG. 3 is an electron micrograph magnifying part of FIG. 2.

As shown in FIGS. 2 and 3, an yttrium oxide coating 20 is made up of the particulate portions 21 and the non-particulate portions 22.

[Manufacturing Method for Plasma Etching Apparatus Component]

A manufacturing method for a plasma etching apparatus component according to the present invention is a method for manufacturing a plasma etching apparatus component which includes a base material, and an yttrium oxide coating configured to cover a surface of the base material.

(Base Material)

Base material used for the manufacturing method for a plasma etching apparatus component according to the present invention is the same as the base material used for the plasma etching apparatus component according to the present invention, and thus description thereof will be omitted.

(Yttrium Oxide Coating)

An yttrium oxide coating used for the manufacturing method for a plasma etching apparatus component according to the present invention is formed by the impact sintering process and configured to cover a surface of the base material, as with the yttrium oxide coating used for the plasma etching apparatus component according to the present invention.

In this way, the yttrium oxide coating used for the manufacturing method for a plasma etching apparatus component according to the present invention is the same as the yttrium oxide coating used for the plasma etching apparatus component according to the present invention, and thus description thereof will be omitted.

(Film Deposition Apparatus)

A film deposition apparatus which covers the surface of the base material with an yttrium oxide coating using the impact sintering process will be described.

The film deposition apparatus includes, for example, a combustion unit which equips a combustion chamber for burning a combustion source such as combustion gas and sprays a flame to the outside from the combustion chamber as a high-speed combustion flame via a combustion flame port, a slurry supply port which supplies raw slurry containing yttrium oxide base powder to the combustion flame sprayed through the combustion flame port of the combustion unit, and a nozzle which controls spraying conditions of the combustion flame containing yttrium oxide base powder.

Specifically, the combustion unit includes, for example, the combustion chamber, a combustion source supply port which supplies a combustion source to the combustion chamber, and the combustion flame port which is configured to be smaller in cross section than that of the combustion chamber and sprays a flame to the outside from the combustion chamber as a high-speed combustion flame.

The slurry supply port is normally installed so as to supply the raw slurry to a flank of the sprayed combustion flame.

Examples of the combustion source include oxygen, acetylene, and kerosene. Two or more combustion sources may be used in combination as required.

Using the film deposition apparatus configured as described above, almost unmolten yttrium oxide base powder in the combustion flame is sprayed together with the combustion flame toward the surface of the base material through a nozzle at high speed, thereby an yttrium oxide coating is formed on the surface of the base material by the impact sintering process.

Incidentally, the film deposition apparatus may further include, as required, a compressed air supply port which supplies compressed air to the combustion flame. The compressed air supply port is equipped so as to supply compressed air, for example, to the combustion flame sprayed through the combustion flame port or to the combustion flame supplied with raw slurry from the slurry supply port. Installation of the compressed air supply port which allows compressed air to be supplied to the combustion flame makes it easy to supply the combustion flame containing yttrium oxide base powder at high speed.

The manufacturing method for a plasma etching apparatus component according to the present invention includes a step of supplying raw slurry containing yttrium oxide base powder to a combustion flame sprayed from a combustion chamber (yttrium oxide base powder supply step), and a step of spraying the yttrium oxide base powder in the combustion flame into the surface of the base material at a spraying speed of 400 to 1000 m/sec. (yttrium oxide base powder spraying step).

(Yttrium Oxide Base Powder Supply Step)

The yttrium oxide base powder supply step is a step of supplying raw slurry containing yttrium oxide base powder to a combustion flame sprayed from a combustion chamber.

<Raw Slurry>

The raw slurry containing yttrium oxide base powder used in the present invention is produced by dispersing yttrium oxide base powder serving as base powder in a solvent.

The purity of yttrium oxide in the yttrium oxide base powder serving as base powder is normally 99.9% or above, and preferably 99.99% or above.

The reason why the purity of yttrium oxide in the yttrium oxide base powder is normally 99.9% or above is the same as the reason why the purity of yttrium oxide coating in the yttrium oxide coating of the plasma etching apparatus component according to the present invention is normally 99.9% or above, and thus description thereof will be omitted.

The average particle size of the yttrium oxide base powder is normally 1 to 5 μm, and preferably 1 to 3 μm.

The average particle size here refers to a cumulative volume average particle size $D_{50}$ measured using a laser particle size distribution measuring device.

When the average particle size of the yttrium oxide base powder is 5 μm or below, at the time of colliding fine particles of the yttrium oxide base powder with the surface of the base material or yttrium oxide coating, crushing of fine particles of the yttrium oxide base powder proceeds appropriately. Thus, heat generated by the crushing facilitates bonding of yttrium oxide particles, and a coating is easily to be formed. Because of high bonding strength among yttrium oxide particles, the yttrium oxide coating formed in this way reduces wear caused by plasma attacks and radical attacks, decreases particle generation, and improves plasma resistance.

On the other hand, when the average particle size of the yttrium oxide base powder exceeds 5 μm, it becomes difficult to form an yttrium oxide coating because the yttrium oxide base powder scatters instead of being crushed when the yttrium oxide base powder collides with the surface of the base material or yttrium oxide coating. Further, there is a possibility that the yttrium oxide coating will be damaged by a blast effect of the yttrium oxide base powder itself, thus crack develops in the yttrium oxide coating.

When the average particle size of the yttrium oxide base powder is less than 1 μm, the yttrium oxide base powder is difficult to be crushed when the yttrium oxide base powder collides with the surface of the base material or yttrium oxide coating. Thus, there is a possibility that the obtained yttrium oxide coating has a low film density, and reduced plasma resistance and corrosion resistance.

Incidentally, as long as the average particle size of the yttrium oxide base powder is normally 1 to 5 μm, the yttrium oxide base powder may contain yttrium oxide particles with a particle size of less than 1 μm. For example, as long as the average particle size of the yttrium oxide base powder is normally 1 to 5 μm, the yttrium oxide base powder may contain yttrium oxide particles with a particle size of less than 1 μm in a volume less than about 5% of all the yttrium oxide base powder.

Normally, the maximum particle size of the yttrium oxide base powder is less than 20 μm. When the yttrium oxide base powder contains coarse particles with a particle size of 20 μm or above, it is difficult to make the thickness of the yttrium oxide coating uniform.

Possible methods for making the maximum particle size of the yttrium oxide base powder less than 20 μm include, for example, a method in which the yttrium oxide base powder or its raw material, i.e., yttrium oxide powder, is sufficiently crushed.

If the particle size of the yttrium oxide base powder is controlled in the present step, a mix ratio of the particulate portions and non-particulate portions in the yttrium oxide coating can be controlled.

As the solvent in which the yttrium oxide base powder is dispersed, a relatively volatile organic solvent such as methyl alcohol or ethyl alcohol is used.

An yttrium oxide base powder content, i.e., a slurry concentration, in the raw slurry is normally 30 to 80% by volume, and preferably 40 to 70% by volume.

When the slurry concentration is in the range of 30 to 80% by volume, the raw slurry is supplied smoothly to the slurry supply port with an appropriate fluidity, thus a stable amount of raw slurry is supplied to the combustion flame. Thereby, the film thickness and composition of the yttrium oxide coating becomes uniform easily.

<Supplying Raw Slurry to Combustion Flame>

As described above, the slurry supply port of the film deposition apparatus is normally installed so as to supply the raw slurry to a flank of the sprayed combustion flame. The combustion flame has a high spraying speed.

Thus, normally, part of the yttrium oxide base powder in the raw slurry supplied to the flank of the combustion flame is sprayed with the combustion flame by getting inside the combustion flame, and the rest of the yttrium oxide base powder is sprayed while staying outside the combustion flame without contact with the combustion flame.

Further, even when the yttrium oxide base powder in the raw slurry is sprayed with the combustion flame by getting inside the combustion flame, how deep the yttrium oxide base powder in the raw slurry is supplied into the combustion flame varies depending on conditions such as the speed at which the raw slurry is supplied to the combustion flame.

According to the present invention, preferably, the yttrium oxide base powder in the raw slurry is supplied to a center portion of the combustion flame. Because, the spraying speed of the yttrium oxide base powder in the combustion flame stabilizes and becomes less prone to variation, and temperature of the combustion flame becomes constant, therefore to control texture of yttrium oxide in the particulate portions and non-particulate portions of the yttrium oxide coating is easy.

Supplying the yttrium oxide base powder in the raw slurry to the center portion of the combustion flame means that the yttrium oxide base powder in the raw slurry is supplied from the flank of the combustion flame up to the central portion. Further, the center portion of the combustion flame is a center portion of a cross section perpendicular to a spraying direction of the combustion flame sprayed through the combustion flame port.

On the other hand, when the yttrium oxide base powder in the raw slurry is supplied only to the flank of the combustion flame or an outer portion of the combustion flame without being supplied to the center portion of the combustion flame, the spraying speed of the yttrium oxide base powder in the combustion flame remains unstable and becomes prone to variation, and the temperature of the combustion flame varies widely, therefore it is difficult to control the texture of the yttrium oxide in the particulate portions and non-particulate portions of the yttrium oxide coating.

Possible methods for causing the raw slurry to be supplied to the center portion of the combustion flame include, for example, a method in which an amount and speed of the raw slurry supplied to the combustion flame is regulated.

(Yttrium Oxide Base Powder Spraying Step)

The combustion flame and yttrium oxide base powder prepared in the previous step is sprayed at the base material through a nozzle of the film deposition apparatus. The nozzle controls the spraying conditions of the combustion flame and yttrium oxide base powder. The spraying conditions to be controlled include, for example, the spraying speed of the yttrium oxide base powder.

The nozzle of the film deposition apparatus is normally installed so as to spray the combustion flame and yttrium oxide base powder in a lateral direction. The surface of the base material is normally placed so as to be positioned on an extension line of the laterally-oriented nozzle of the film deposition apparatus.

The yttrium oxide base powder spraying step is a step of spraying the yttrium oxide base powder in the combustion flame at the surface of the base material at a spraying speed of 400 to 1000 m/sec.

<Spraying Speed> when the spraying speed of the yttrium oxide base powder is 400 to 1000 m/sec., at the time of colliding the yttrium oxide base powder with the base material or yttrium oxide coating, the yttrium oxide base powder is crushed sufficiently, thus an yttrium oxide coating with a high film density and an appropriate mixture ratio between cubic crystals and monoclinic crystals can be obtained.

The spraying speed of the yttrium oxide base powder here refers to the spraying speed of the yttrium oxide base powder at a nozzle tip of the film deposition apparatus.

As described above, in terms of crystal structure, the particles of the yttrium oxide base powder is normally made up of only cubic crystals at room temperature. However, in the crystal structure, the yttrium oxide base powder tends to turn into monoclinic crystals by melting or the like when exposed to high temperatures at about the level of the combustion flame. For example, when a film is formed by the thermal spraying process using yttrium oxide base powder as raw material, most or all of the yttrium oxide in the resulting yttrium oxide coating form monoclinic crystals.

In contrast, since the present step uses the impact sintering process in which yttrium oxide base powder is sprayed at the above-described speed, which is a speed equal to or higher than a critical speed at which yttrium oxide base powder starts to deposit on the surface of the base material or yttrium oxide coating, the yttrium oxide base powder can be sprayed almost without melting. Consequently, crystal structure of the yttrium oxide in the sprayed yttrium oxide base powder remains as chemically stable cubic crystals. Further, crystal structure of part of the yttrium oxide making up the yttrium oxide coating obtained by deposition changes into monoclinic crystals under the influence of destructive heat resulting from the impact, but crystal structure of the rest of the yttrium oxide remains as chemically stable cubic crystals. In this way, in the yttrium oxide coating according to the present invention, cubic crystals and monoclinic crystals coexist at an appropriate ratio, thus the film density and film strength are increased.

On the other hand, when the spraying speed of the yttrium oxide base powder is less than 400 m/sec., since the yttrium oxide base powder has low collision energy, when the yttrium oxide base powder collides with the base material or yttrium oxide coating, the yttrium oxide base powder is not crushed sufficiently, and consequently, it is difficult to obtain an yttrium oxide coating with high film density and film strength.

Further, when the spraying speed of the yttrium oxide base powder exceeds 1000 m/sec., since the yttrium oxide base powder has high collision energy, when the yttrium oxide base powder collides with the base material or yttrium oxide coating, there is a possibility that the yttrium oxide coating is damaged by the blast effect of the yttrium oxide base powder itself, thus crack is developed in the yttrium oxide coating.

When the spraying speed of the yttrium oxide base powder is controlled in the present step, it is possible to control the mix ratio of the particulate portions and non-particulate portions in the yttrium oxide coating as well as the mix ratio of cubic crystals and monoclinic crystals in the yttrium oxide coating.

<Spraying Distance>

According to the present invention, a spraying distance between a tip portion of the nozzle and the surface of the base material is normally 100 to 400 mm, and preferably 100 to 200 mm.

When the spraying distance is 100 to 400 mm, at the time that the sprayed yttrium oxide base powder collides with the base material or yttrium oxide coating, the particles of the yttrium oxide base powder is crushed by appropriate impact strength, thus an yttrium oxide coating in which the particulate portions and the non-particulate portions are mixed appropriately and cubic crystals and monoclinic crystals coexist at an appropriate ratio.

On the other hand, when the spraying distance is less than 100 mm, the yttrium oxide base powder has so few opportunities of collision because of too short distance that the yttrium oxide base powder is not crushed sufficiently. Consequently, it is difficult to obtain an yttrium oxide coating in which the particulate portions and the non-particulate portions are mixed appropriately and cubic crystals and monoclinic crystals coexist at an appropriate ratio.

Further, when the spraying distance exceeds 400 mm, the impact strength becomes so weak because of too long distance that the yttrium oxide base powder is not crushed sufficiently. Consequently, it is difficult to obtain an yttrium oxide coating in which the particulate portions and the non-particulate portions are mixed appropriately and cubic crystals and monoclinic crystals coexist at an appropriate ratio.

<Film Thickness>

The film thickness of the yttrium oxide coating obtained in the present step is normally 10 μm or above, preferably 10 to 200 μm, and more preferably 50 to 150 μm.

The reason why the film thickness of the yttrium oxide coating obtained in the present step is normally 10 μm or above is the same as the reason why the film thickness of the yttrium oxide coating of the plasma etching apparatus component according to the present invention is normally 10 µm or above, and thus description thereof will be omitted.

Incidentally, in forming an oxide coating such as an yttrium oxide coating on the surface of the base material for a conventional plasma etching apparatus component, it is necessary to apply pre-treatment such as a blasting process to the surface of base material using abrasive grains. Consequently, the conventional plasma etching apparatus component has a problem in that residual fragments of blasting material such as abrasive grains are left on the surface of the base material or a fractured formation is produced on the surface of the base material, thus the entire oxide coating is prone to film separation.

In contrast, with the manufacturing method for a plasma etching apparatus component according to the present invention, there is no need to apply a blasting process to the surface of base material before forming an yttrium oxide coating on the surface of the base material by the impact sintering process. With the present invention, when yttrium oxide base powder is sprayed at high speed using the impact sintering process, the oxide coating on the surface of the base material is destroyed by the colliding yttrium oxide base powder, revealing an active surface and thereby producing an effect similar to that of the blasting process. Consequently, the present invention eliminates the need to carry out the blasting process separately. Thus, since the blasting process can be eliminated, the present invention can reduce production cost.
(Advantages of Plasma Etching Apparatus Component and Manufacturing Method for Plasma Etching Apparatus Component)

With the plasma etching apparatus component according to an embodiment as well as the plasma etching apparatus component obtained by the manufacturing method for a plasma etching apparatus component according to the embodiment, since an yttrium oxide coating is formed using the impact sintering process which deposits the yttrium oxide base powder almost without melting the yttrium oxide base powder, flat-shaped molten particles are less prone to be generated, and consequently, surface defects of the yttrium oxide coating can be reduced.

Further, with the plasma etching apparatus component according to the embodiment as well as the plasma etching apparatus component obtained by the manufacturing method for a plasma etching apparatus component according to the embodiment, since the yttrium oxide coating can be made denser and its surface can be made smoother, internal defects of the yttrium oxide coating can be reduced.

Furthermore, with the plasma etching apparatus component according to the embodiment as well as the plasma etching apparatus component obtained by the manufacturing method for a plasma etching apparatus component according to the embodiment, the crystal structure of the yttrium oxide making up the yttrium oxide coating has high stability, thus chemical stability of the yttrium oxide coating is improved.

In this way, the yttrium oxide coating for the plasma etching apparatus component according to the embodiment as well as for the plasma etching apparatus component obtained by the manufacturing method for a plasma etching apparatus component according to the embodiment is relatively free of surface defects and internal defects and have high chemical stability. Thus, the plasma etching apparatus component and manufacturing method thereof according to the embodiment stably and effectively curb particle generation from the plasma etching apparatus component.

Further, the plasma etching apparatus component according to the embodiment as well as the plasma etching apparatus component obtained by the manufacturing method for a plasma etching apparatus component according to the embodiment, reduce the frequency of cleaning of the plasma etching apparatus to thereby improve availability of the plasma etching apparatus, thereby increase productivity.

Furthermore, with the plasma etching apparatus component according to the embodiment as well as the plasma etching apparatus component obtained by the manufacturing method for a plasma etching apparatus component according to the embodiment, a replacement frequency of the plasma etching apparatus component is decreased, thus cost of the plasma etching apparatus component is reduced.

Further, products such as thin films and elements produced by a plasma etching apparatus equipping the plasma etching apparatus component according to the embodiment as well as with the plasma etching apparatus component obtained by the manufacturing method for a plasma etching apparatus component according to the embodiment have high yields.
(Advantage of Manufacturing Method for Plasma Etching Apparatus Component)

The manufacturing method for a plasma etching apparatus component according to the embodiment eliminates the need to apply a blasting process to the surface of the base material before forming an yttrium oxide coating on the surface of the base material.

EXAMPLES

Examples are shown below, but the present invention should not be interpreted by limiting to these examples.

Examples 1 to 7 and Comparative Example 1

Base Material

An aluminum plate measuring 100 mm long×200 mm wide was prepared as a base material.
(Preparation of Raw Slurry)

Raw slurry of a composition shown in Table 1 was prepared by mixing base powder made of an oxide shown in Table 1 with ethyl alcohol acting as a solvent.

Yttrium oxide base powder with a purity of 99.99% or above by mass was used in experimental examples. The yttrium oxide base powder was made of cubic crystals and did not contain coarse particles larger than 20 µm as a result of sufficient crushing and sieving.
(Creation of Yttrium Oxide Coating)

Using a combustion flame spraying apparatus (film deposition apparatus), the raw slurry was supplied to the combustion flame under supply conditions shown in Table 1 by an impact sintering process and the yttrium oxide base powder in the raw slurry was sprayed at the base material under the spraying conditions shown in Table 1.

The raw slurry was supplied to the combustion flame using a method for supplying the raw slurry up to the center portion of the combustion flame (examples 1 to 6) and a method for supplying the raw slurry to the combustion flame without reaching the center portion (example 7).

In examples 1 to 7, the yttrium oxide base powder in the combustion flame was sprayed in an almost unmolten state, and then deposited on the surface of the base material to form an yttrium oxide coating. As a result, a plasma etching apparatus component was obtained.

Further, as a comparative example, a plasma etching apparatus component was created using base powder made of the oxide shown in Table 1 under the same conditions as those of example 1 except that a plasma spraying process was used instead of the impact sintering process (comparative example 1).

Production conditions and thickness of the yttrium oxide coating are shown in Table 1.

TABLE 1

| | Base Powder | | Raw Slurry | | | | Thickness | |
|---|---|---|---|---|---|---|---|---|
| | Type | Average Particle Size (μm) | Rate of Raw Powder (vol. %) | Supply to Center Portion of Combustion Flame | Spraying Speed (m/sec) | Spraying Distance (mm) | of Yttrium Oxide Coating (μm) | Remarks |
| Example 1 | $Y_2O_3$ | 1.4 | 50 | Done | 500 | 150 | 200 | |
| Example 2 | $Y_2O_3$ | 3.0 | 80 | Done | 600 | 100 | 100 | |
| Example 3 | $Y_2O_3$ | 3.0 | 70 | Done | 800 | 300 | 50 | |
| Example 4 | $Y_2O_3$ | 4.0 | 40 | Done | 400 | 130 | 30 | |
| Example 5 | $Y_2O_3$ | 5.0 | 30 | Done | 600 | 150 | 150 | |
| Example 6 | $Y_2O_3$ | 10.0 | 40 | Done | 500 | 250 | 180 | |
| Example 7 | $Y_2O_3$ | 1.4 | 40 | Not Done | 500 | 200 | 50 | |
| Compatative Example 1 | $Y_2O_3$ | 1.4 | — | — | — | — | 50 | Film Deposition by Thermal Spraying Process |

(Evaluation of Yttrium Oxide Coating of Plasma Etching Apparatus Component)

With respect to the yttrium oxide coatings of the obtained plasma etching apparatus components, the film density, area coverage ratios of particulate portions (particles whose grain boundaries are observable) and non-particulate portions (particles whose grain boundaries are not observable), and average particle size of the particulate portions were measured.

<Film Density>

Regarding the film density, first, an enlarged photograph at a magnification of 500 was taken such that the total unit area of a cross section would be 200 μm×200 μm. Next, the proportion of a void area per unit area of the enlarged photograph was calculated as a void ratio (%), the void ratio (%) was subtracted from 100%, and the value of the difference was designated as a film density (%).

<Area Coverage Ratios of Particulate Portions and Non-Particulate Portions>

An enlarged photograph covering a unit area of 20 μm×20 μm was taken of the surface of the yttrium oxide coating at a magnification of 5000. Then, each yttrium oxide particle whose grain boundary was visually identifiable was designated as a particle with an observable grain boundary (particulate portion) and each yttrium oxide particle whose grain boundary was not identifiable due to bonding was designated as a particle with a non-observable grain boundary (non-particulate portion), and the area coverage ratio of the particulate portions and non-particulate portions were determined. The total of the area coverage ratio of the particulate portions and area coverage ratio of the non-particulate portions is 100%.

The above procedures were carried out for arbitrary three locations on the surface of the yttrium oxide coating and the area coverage ratio of the particulate portions and area coverage ratio of the non-particulate portions were determined for each of the three locations. Furthermore, the average value of the area coverage ratios of the particulate portions at the three locations and the average value of the area coverage ratios of the non-particulate portions at the three locations were determined.

<Average Particle Size of Particulate Portions>

Using the enlarged photograph at a magnification of 5000 taken to calculate the area coverage ratios of the particulate portions and non-particulate portions, the average particle size of the particulate portions were measured.

To begin with, the length of the line segment linking the most distant two points on the grain boundary of a particulate portion shown in the enlarged photograph at a magnification of 5000 was measured and designated as the particle size of the particulate portion. Subsequently, the particle sizes of 50 particulate portions shown in the enlarged photograph at a magnification of 5000 were measured and the arithmetic mean value of the particle sizes of the 50 particulate portions was determined as the average particle size of the particulate portions.

Measurement results are shown in Table 2, including those on the film density, area coverage ratios of the particulate portions and non-particulate portions, and average particle size of the particulate portions.

TABLE 2

| | Film Density (%) | Area Coverage Ratio of Particulate Portions (%) | Area Coverage Ratio of Non-Particulate Portions (%) | Average Particle Size of Particulate Portions (μm) |
|---|---|---|---|---|
| Example 1 | 99.1 | 20 | 80 | 1.2 |
| Example 2 | 99.0 | 15 | 85 | 2.8 |
| Example 3 | 97.2 | 35 | 65 | 2.9 |
| Example 4 | 99.9 | 0 | 100 | — |
| Example 5 | 99.8 | 5 | 95 | 3.6 |
| Example 6 | 96.5 | 50 | 50 | 4.2 |
| Example 7 | 93.2 | 75 | 25 | 1.3 |
| Compatative Example 1 | 94.0 | 2 | 98 | 1.7 |

As can be seen from the results shown in Table 2, with the plasma etching apparatus components in examples 1 to 7, the film density of the yttrium oxide coating is high and the area coverage ratio of the particulate portions is in a range of 0 to 80%.

Further, it was found that in the case of the plasma etching apparatus components in examples 1 to 7, which were created using the impact sintering process, the average particle size of the particulate portions of the yttrium oxide coating was smaller than the average particle size of the yttrium oxide base powder.

On the other hand, it was found that in the case of the plasma etching apparatus component in comparative example 1, which was created using the thermal spraying process, the average particle size of the particulate portions of the yttrium oxide coating was larger than the average particle size of the yttrium oxide base powder.

Further, with the plasma etching apparatus components in examples 1 to 6, the surface roughness Ra of the yttrium oxide coating was 3 µm or below. Furthermore, with the plasma etching apparatus component in example 7, the surface roughness Ra of the yttrium oxide coating was 6.2 µm. It is believed that this is because the low number of non-particulate portions increased surface asperities. On the other hand, with the plasma etching apparatus component in comparative example 1, the surface roughness Ra of the yttrium oxide coating was 3.4 µm.

(Etch Test of Plasma Etching Apparatus Component)

The respective plasma etching apparatus components of the examples and comparative example were placed in a plasma etching apparatus and exposed to an etching gas mixture of $CF_4$ (with a flow rate of 50 sccm), $O_2$ (with a flow rate of 20 sccm), and Ar (with a flow rate of 50 sccm).

In an etching chamber, pressure was set to 10 mTorr, power was set to 300 W, and bias was set to 100 W, and the plasma etching apparatus was operated continuously for 2 hours.

<Amount of Weight Reduction>

With respect to the yttrium oxide coatings of the plasma etching apparatus components, the weight before and after plasma etching was measured and the amounts of weight reduction caused by the plasma etching were measured.

<Adhesion Area Ratio>

A peeling test was conducted on the yttrium oxide coatings of the plasma etching apparatus components after plasma etching using a tape peeling method and an adhesion area ratio was measured.

The adhesion area ratio here is a ratio of the area of peeled tape on which yttrium oxide particles exist to the total area (125 µm×95 µm) of the tape adhering to the yttrium oxide coating. The smaller the value of the adhesion area ratio is, the more preferable. For example, if the area of peeled tape on which yttrium oxide particles exist is 125 µm×95 µm, the adhesion area ratio is 100%, which is the worst value.

Measurement results are shown in Table 3, including those on the amounts of weight reduction and adhesion area ratio.

TABLE 3

|  | Amount of Weight Reduction caused by Plasma Etching (mg/cm$^2$) | Adhesion Area Ratio in Peeling Test (%) |
| --- | --- | --- |
| Example 1 | 0.133 | 0.287 |
| Example 2 | 0.147 | 0.315 |
| Example 3 | 0.173 | 0.362 |
| Example 4 | 0.152 | 0.305 |
| Example 5 | 0.147 | 0.297 |
| Example 6 | 0.159 | 0.324 |
| Example 7 | 0.162 | 0.353 |
| Compatative Example 1 | 0.547 | 5.873 |

As can be seen from the results shown in Table 3, the yttrium oxide coatings of the dry etching apparatus components in examples 1 to 7 have small amounts of weight reduction and small values of adhesion area ratio, this means that the yttrium oxide coatings have high resistance to plasma attacks and radical attacks. Thus, it is believed that particle generation can be curbed effectively if any of the dry etching apparatus components in examples 1 to 7 is used as a component of a dry etching apparatus.

Examples 8 to 14

Plasma etching apparatus components were created under the same conditions as example 1 except that production conditions and the thickness of the yttrium oxide coatings were changed as shown in Table 4.

Yttrium oxide base powder with a purity of 99.99% or above by mass was used in the experimental examples. The yttrium oxide base powder was made of cubic crystals and did not contain coarse particles larger than 20 µm as a result of sufficient crushing and sieving.

Production conditions and thickness of the yttrium oxide coating are shown in Table 4.

TABLE 4

|  | Base Powder | | Raw Slurry | |  |  | Thickness |
| --- | --- | --- | --- | --- | --- | --- | --- |
|  | Type | Average Particle Size (µm) | Rate of Raw Powder (vol. %) | Supply to Center Portion of Combustion Flame | Spraying Speed (m/sec) | Spraying Distance (mm) | of Yttrium Oxide Coating (µm) |
| Example 8 | $Y_2O_3$ | 2.0 | 55 | Done | 500 | 150 | 200 |
| Example 9 | $Y_2O_3$ | 3.0 | 80 | Done | 600 | 100 | 100 |
| Example 10 | $Y_2O_3$ | 3.5 | 70 | Done | 800 | 300 | 50 |
| Example 11 | $Y_2O_3$ | 4.0 | 40 | Done | 400 | 140 | 130 |
| Example 12 | $Y_2O_3$ | 1.5 | 30 | Done | 600 | 150 | 160 |
| Example 13 | $Y_2O_3$ | 4.5 | 40 | Done | 500 | 250 | 60 |
| Example 14 | $Y_2O_3$ | 2.5 | 35 | Not Done | 500 | 200 | 80 |

(Evaluation of Yttrium Oxide Coating of Plasma Etching Apparatus Component)

With respect to the yttrium oxide coatings of the resulting plasma etching apparatus components, the film density, area coverage ratios of particulate portions (particles whose grain boundaries are observable) and non-particulate portions (particles whose grain boundaries are not observable), and average particle size of the particulate portions were measured in a manner similar to example 1.

Further, with respect to the yttrium oxide coatings of the obtained plasma etching apparatus components, peak value ratios (Im/Ic) of the yttrium oxide coatings were measured.

<Peak Value Ratio (Im/Ic) of Yttrium Oxide Coating>

The crystal structure of the surfaces of the yttrium oxide coatings were studied by conducting x-ray surface analysis using a Cu target at an x-ray tube voltage of 40 kV and x-ray tube current of 40 mA.

Next, the peak value ratio (Im/Ic) was calculated by dividing the peak value Im of the strongest peak of a monoclinic crystal by the peak value Ic of the strongest peak of a cubic crystal.

The strongest peak of a monoclinic crystal here refers to the peak with the largest peak value, of plural peaks of the monoclinic crystal. The strongest peak of a cubic crystal refers to the peak with the largest peak value, of plural peaks of the cubic crystal.

Measurement results are shown in Table 5, including those on the film density, area coverage ratios of the particulate portions and non-particulate portions, average particle size of the particulate portions, and peak value ratio (Im/Ic) of the yttrium oxide coatings.

TABLE 5

| | Film Density (%) | Area Coverage Ratio of Particulate Portions (%) | Area Coverage Ratio of Non-Particulate Portions (%) | Peak Value Ratio Im/Ic | Average Particle Size of Particulate Portions (μm) |
|---|---|---|---|---|---|
| Example 8 | 99.2 | 24 | 76 | 0.5 | 1.2 |
| Example 9 | 99.0 | 16 | 84 | 0.4 | 2.8 |
| Example 10 | 97.3 | 35 | 65 | 0.3 | 2.9 |
| Example 11 | 99.9 | 0 | 100 | 0.6 | — |
| Example 12 | 99.8 | 5 | 95 | 0.5 | 1.2 |
| Example 13 | 96.5 | 48 | 52 | 0.2 | 4.2 |
| Example 14 | 93.5 | 75 | 25 | 0.3 | 1.3 |

As can be seen from the results shown in Table 5, with the plasma etching apparatus components in examples 8 to 14, the film density of the yttrium oxide coating is high and the area coverage ratio of the particulate portions is in a range of 0 to 80%.

Further, it was found that with the plasma etching apparatus components in examples 8 to 14, the average particle size of the particulate portions of the yttrium oxide coating was smaller than the average particle size of the yttrium oxide base powder.

Furthermore, with the plasma etching apparatus components in examples 8 to 14, the peak value ratio (Im/Ic) was in a range of 0.2 to 0.6.

Further, with the plasma etching apparatus components in examples 8 to 14, the surface roughness Ra of the yttrium oxide coating was 3 μm or below.

(Etch Test of Plasma Etching Apparatus Component)

With respect to the yttrium oxide coatings of the resulting plasma etching apparatus components, the amounts of weight reduction and adhesion area ratio were measured in a manner similar to example 1.

Further, with respect to the yttrium oxide coatings of the obtained plasma etching apparatus components, film strength was measured.

<Film Strength>

The film strength was measured by a Sebastian tensile test method. That is, a test terminal was bonded to the surface of the yttrium oxide coating using an epoxy adhesive and the test terminal was pulled in a direction perpendicular to the surface of the yttrium oxide coating to determine peel strength between the base material and yttrium oxide coating.

The film strength was measured in comparative example 1 as well.

Measurement results are shown in Table 6, including those on the amount of weight reduction, adhesion area ratio, and film strength.

TABLE 6

| | Amount of Weight Reduction caused by Plasma Etching (mg/cm$^2$) | Adhesion Area Ratio in Peeling Test (%) | Film Strength (MPa) |
|---|---|---|---|
| Example 8 | 0.132 | 0.631 | 76.9 |
| Example 9 | 0.143 | 0.705 | 73.6 |
| Example 10 | 0.149 | 0.828 | 63.7 |
| Example 11 | 0.122 | 0.613 | 83.3 |
| Example 12 | 0.138 | 0.770 | 69.8 |
| Example 13 | 0.157 | 0.953 | 53.5 |
| Example 14 | 0.151 | 0.881 | 59.5 |
| Compatative Example 1 | 0.547 | 5.873 | 28.3 |

As can be seen from the results shown in Table 6, the yttrium oxide coatings of the dry etching apparatus components in examples 8 to 14 have small amounts of weight reduction, small values of the adhesion area ratio, and high resistance to plasma attacks and radical attacks. Thus, it is believed that particle generation can be curbed effectively if any of the dry etching apparatus components in examples 8 to 14 is used as a component of a dry etching apparatus.

Further, it was found that the plasma etching apparatus components in examples 8 to 14 had high film strength.

From the above results, it was found that the yttrium oxide coatings of the plasma etching apparatus components in examples 8 to 14 were able to curb development of cracks and chips even if the yttrium oxide coatings are subjected to plasma attacks and radical attacks. On the other hand, it was found that the plasma etching apparatus component in comparative example 1 had a very low film strength of 28.3 MPa.

Although in each of the above examples, the yttrium oxide coating was formed directly on the surface of the component body, if at least one oxide film layer made of $Al_2O_3$ or the like is formed on the surface of the component body and an yttrium oxide coating is formed on the outermost surface of the component body, the insulating properties of the component can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

DESCRIPTION OF SYMBOLS

1 Plasma etching apparatus component
10 Base material
20 Yttrium oxide coating
21 Particulate portion
22 Non-particulate portion

The invention claimed is:
1. A plasma etching apparatus component comprising:
   a base material; and
   an yttrium oxide coating formed by an impact sintering process in which all yttrium oxide base powder is substantially unmolten while being sprayed onto the base material and adhered to the surface of the base material, and the yttrium oxide coating is configured to cover a surface of the base material, wherein the yttrium oxide coating contains at least one of particulate portions made of yttrium oxide and non-particulate portions made of yttrium oxide, where the particulate portions are portions in which a grain boundary partitioning inner and outer regions of a crystal grain is observed under a microscope, and the non-particulate portions are portions in which the grain boundary is not observed under a microscope, the yttrium oxide coating has a film thickness of 10 μm or above and a film density of 90% or above, when a surface of the yttrium oxide coating is observed under a microscope, in an observation field of 20 μm×20 μm, the particulate portions have an area coverage ratio of 0 to 80% and the non-particulate portions have an area coverage ratio of 20 to 100%, and wherein when a peak value of the strongest peak of a cubic crystal is denoted by Ic and a peak value of the strongest peak of a monoclinic crystal is denoted by Im, both the peak values being obtained by XRD analysis, the yttrium oxide coating has a peak value ratio Im/Ic of 0.2 to 0.6.

2. The plasma etching apparatus component according to claim 1, wherein purity of yttrium oxide in the yttrium oxide coating is 99.9% or above.

3. The plasma etching apparatus component according to claim 1, wherein an average particle size of particulate portions and non-particulate portions in the yttrium oxide coating is 5 μm or below.

4. The plasma etching apparatus component according to claim 1, wherein the yttrium oxide coating has a film thickness of 10 to 200 μm, and a film density of 99 to 100%.

5. The plasma etching apparatus component according to claim 1, wherein an average particle size of the particulate portions in the yttrium oxide coating is 2 μm or below.

6. The plasma etching apparatus component according to claim 3, wherein purity of yttrium oxide in the yttrium oxide coating is 99.99% or above.

7. The plasma etching apparatus component according to claim 1, wherein the yttrium oxide coating has a surface roughness Ra of 3 μm or below.

\* \* \* \* \*